(12) United States Patent
Mallinson

(10) Patent No.: US 7,193,552 B2
(45) Date of Patent: *Mar. 20, 2007

(54) FLASH ANALOG-TO-DIGITAL CONVERTER

(75) Inventor: Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/934,918

(22) Filed: Sep. 3, 2004

(65) Prior Publication Data

US 2005/0088330 A1     Apr. 28, 2005

Related U.S. Application Data

(63) Continuation of application No. 10/346,034, filed on Jan. 15, 2003, now Pat. No. 6,803,871, which is a continuation of application No. 10/118,224, filed on Apr. 5, 2002, now Pat. No. 6,646,585.

(51) Int. Cl.
*H03M 1/36* (2006.01)

(52) U.S. Cl. ...................................... 341/159; 341/155

(58) Field of Classification Search ................ 341/159, 341/155, 167, 170, 144
See application file for complete search history.

(56) References Cited

U.S. PATENT DOCUMENTS 4,464,727 A * 8/1984 Parkes et al. ............... 708/273
4,596,976 A * 6/1986 Mangelsdorf et al. ...... 341/133
6,646,585 B2 * 11/2003 Mallinson ................... 341/159
6,803,871 B2 * 10/2004 Mallinson ................... 341/159

FOREIGN PATENT DOCUMENTS

| JP | 05037375 | 2/1993 |
| JP | 2000299638 | 10/2000 |

* cited by examiner

*Primary Examiner*—Peguy JeanPierre
(74) *Attorney, Agent, or Firm*—Haynes Beffel & Wolfeld LLP

(57) ABSTRACT

A differential input flash analog-to-digital converter in which an array of comparators is connected to compare reference signals within a parabolic distribution of such signals generated by the application of a differential input signal across an impedance network. Preferably, the comparator array comprises at least two pluralities of comparators, the first plurality of comparators comparing pairs of reference nodes separated by a first step size, and the second plurality of comparators comparing pairs of reference nodes separated by a second step size. Even more preferably, the comparator array further comprises a third plurality of comparators comparing pairs of reference nodes separated by a third step size, but only where necessary to maximize the available comparison range of the converter. The flash converter according to the invention provides increased gain from input without accumulation of comparator input currents and without sacrificing the number of actual comparisons of reference signals.

10 Claims, 5 Drawing Sheets

FLASH ANALOG-TO-DIGITAL CONVERTER

This application is a continuation of U.S. Utility patent application Ser. No. 10/346,034, filed on Jan. 15, 2003 now U.S. Pat. No. 6,803,871, and application Ser. No. 10/118,224, filed on Apr. 5, 2002, now U.S. Pat. No. 6,646,585.

BACKGROUND

The invention relates to analog-to-digital converters, and, more particularly, to differential input "flash" converters wherein a plurality of comparisons between an input signal, or a signal related to the input signal, and a corresponding plurality of reference signals are made in order to provide a plurality of bits of the digital output "word" simultaneously.

Analog-to-digital converters are well known in the art. One type of analog-to-digital converter uses a single comparator to successively compare an input signal to a plurality of reference signals. This type of comparator, while inexpensive, is inherently slow since the single comparator must make a number of successive comparisons in order to convert each analog sample into a digital output word.

Another type of analog-to-digital converter is known as the "flash" converter. The flash converter uses a plurality of comparators to simultaneously compare samples of an input signal. A characteristic flash converter is configured such that each first comparator input is connected to an impedance network for supplying each of the comparators with its own predetermined reference signal. Furthermore, each second comparator input is connected to receive an analog input signal, or another signal related to that input signal. Finally, the outputs of the comparators are connected to an encoder or possibly to a corresponding number of digital signal outputs. This enables the comparator to simultaneously provide the plurality of output bits of the digital output word. In order to simultaneously provide the required plurality of comparisons, a separate comparator is typically associated with each reference signal to compare the analog input signal to that reference signal. Therefore, in order to produce a digital output having n bits, at least $2^n-1$ comparators are typically required. These comparators are configured to compare the analog input signal to each of $2^n-1$ reference signals and then produce an output corresponding to one of $2^n$ reference intervals defined by the reference levels.

Another known method provides a flash analog-to-digital converter that uses considerably less than $2^n-1$ actual comparators. This is accomplished by employing a plurality of "pseudo-comparators" between each pair of distantly-spaced actual comparators. These pseudo comparators can generate interstitial outputs that simulate the output of an actual comparator in that position based on weighted averages of the actual comparator outputs. However, the use of such pseudo-comparators would not be appropriate in association with an impedance network that generates a non-linear profile of reference signals. An appropriate network of actual comparators would be necessary in such a case to ensure accuracy.

A known example of such a non-linear profile of reference signals uses a distributed current source across an input impedance network to transform the analog input signal into a parabolic voltage profile, where the position of the voltage peak shifts according to the magnitude of the analog input signal. The distinctive characteristic of this voltage profile is the peak of the parabolic distribution, the position of which is sensed by the comparators. However, this example does not use this parabolic voltage profile in association with a flash converter, but rather with a "bit slice." The bit slice converter that uses n comparators to compare $2^n$ voltage intervals to produce an n-bit digital output. The bit slice converter requires a plurality of parallel-connected "sub-converters", each with its own impedance network on which the input signal needs to be transformed into a parabolic distribution. Thus there is no real savings in circuit components. Furthermore as in the above examples, the comparison range of the comparators is limited. Also, these examples have an added problem of accumulated input currents, resulting in lost gain from high attenuation. Therefore, a need exists for a flash converter that maximizes the available comparison range of the converter while not losing gain from the accumulated input. As will be seen, the invention is directed to these ends.

SUMMARY OF INVENTION

The invention provides a differential input flash analog-to-digital converter and related method of operations, where an array of comparators is connected to compare reference signals within a parabolic distribution of such signals generated by the application of a differential input signal across an impedance network. The comparator array includes at least two pluralities of comparators, the first plurality of comparators comparing pairs of reference nodes separated by a first step size, and the second plurality of comparators comparing pairs of reference nodes separated by a second step size. The comparator array may further include a third plurality of comparators comparing pairs of reference nodes separated by a third step size. These comparators may be strategically placed to maximize the available comparison range of the converter.

A flash converter embodying to the invention provides increased gain from input without accumulation of comparator input currents and without sacrificing the number of actual comparisons of reference signals. Such a flash converter may include an impedance network in the form of a resistor chain, based on a parabolic distribution of voltages along the resistor chain in conjunction with a plurality of comparators connected to the resistor chain. Alternatively, additional pluralities of comparators may be connected to the resistor chain to further increase the comparison range as well as to decrease attenuation of the circuit.

DETAILED DESCRIPTION

Figure 1A:
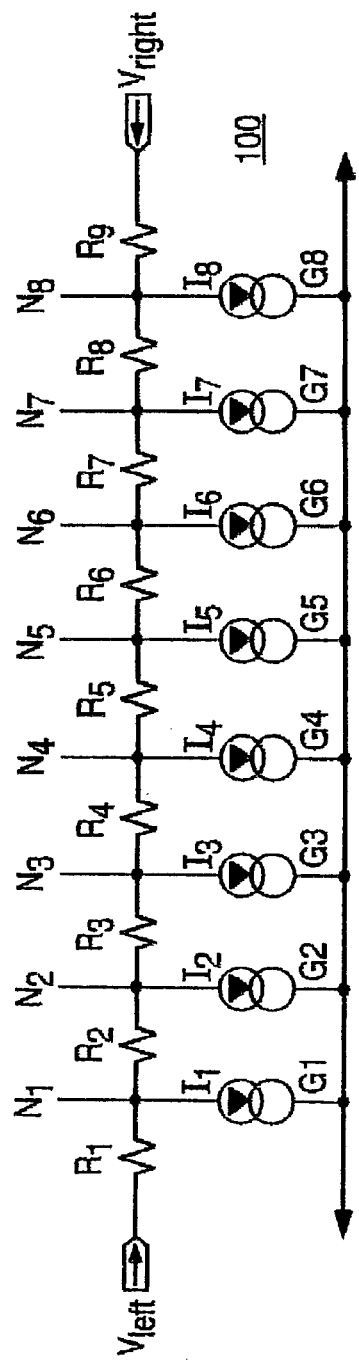
FIG. 1A is a circuit diagram of an impedance network for generating reference signals having a parabolic profile, according to an embodiment of the invention.

FIG. 1A is a circuit diagram of an impedance network for generating reference signals for a flash analog-to-digital converter. In particular, the impedance network takes the form of a resistor chain 100, and is based on a parabolic distribution of voltages along the resistor chain 100 and the use of a plurality of comparators connected to the resistor chain.

As illustrated in FIG. 1A, the resistor chain 100 is illustrated having nine resistors $R_1$, $R_2$, $R_3$, $R_4$, $R_5$, $R_6$, $R_7$, $R_8$, and $R_9$. The resistors are connected in series and defining between them eight nodes $N_1$, $N_2$, $N_3$, $N_4$, $N_5$, $N_6$, $N_7$, and $N_8$. In one embodiment, the resistors, $R_1$–$R_9$, have substantially identical resistance values. In an alternative embodiment, each resistor may have different resistance values to obtain certain results such as a tunable circuit. For example, a set of varying resistors may be employed to advantageously create a linear characteristic that has a modified impedance that affects comparator input circuits. This linear characteristic is a valuable feature for a flash analog to digital circuit.

Currents having a value $SI_1$–$SI_8$ are drawn from each node respectively by a corresponding current source $G_1$, $G_2$, $G_3$, $G_4$, $G_5$, $G_6$, $G_7$, or $G_8$. Similar to the resistance values, these current sources may draw currents of different values, $I_1$–$I_8$. This would allow the circuit to provide a varying bank of resistance values and varying currents. The varying currents may be configured to compensate for the varying resistors to create a linear characteristic that has a modified impedance as seen by the comparator input currents.

A differential input signal is applied to the ends of resistor chain 100. The input signal is the difference between the signals $V_{left}$ and $V_{right}$. The resistor chain 100 in FIG. 1A contemplates use as part of a flash analog-to-digital converter producing a digital output having 3 bits This resistor chain is but one example of such a circuit configured according to the invention. Other variations in number and size of the components are possible without departing from the invention. As will be apparent to a person skilled in the art, the number of resistors and nodes comprising resistor chain 100 will in each case be chosen based on the number of bits desired in the digital output word. In particular, where n is the number of bits desired in the digital output word, the resistor chain 100 will typically have $2^n+1$ resistors defining between them $2^n$ nodes (not counting the ends of resistor chain 100) for measuring reference signals.

In operation, when a current having a value I is drawn from each of nodes $N_1$ through $N_8$ of resistor chain 100, where all resistor values are equal a parabolic distribution of voltages results across resistor chain 100. In particular, where $V_{left}$ and $V_{right}$ are both maintained at zero volts, then, based on symmetry, it is evident that no current flows between nodes $N_4$ and $N_5$, and that the distribution of voltages must be substantially symmetrical overall. The current flowing between nodes $N_3$ and $N_4$ may therefore have a value of I. Hence in a model circuit, the voltage difference between nodes $N_3$ and $N_4$ would have a value of I*R. It follows that the current flowing between nodes $N_2$ and $N_3$ has a value of 2*I. By extension, each difference in voltage is linearly increasing, hence the actual voltage must be a solution to:

$$\frac{\partial V}{\partial N} = K \cdot N$$

where K is a constant and N is the number of nodes between which the voltage difference is measured, which is therefore parabolic. The value of the voltage at each node when $V_{left}$ and $V_{right}$ are both voltages maintained at zero volts is:

$$\frac{\left(\left(\frac{M}{2}-i\right)^2+\left(\frac{M}{2}-i\right)\right)-\left(\left(\frac{M}{2}\right)^2+\left(\frac{M}{2}\right)\right)}{2} \cdot I \cdot R$$

where M is the total number of nodes in resistor chain 100 (not counting the ends of resistor chain 100) and i is an index identifying a particular node (for example, the index i of node $N_2$ is 2, the index i of node $N_3$ is 3, etc.).

In the resistor chain 100 illustrated in FIG. 1A, where M=8, and when I*R has a value of one volt, the value of the voltage at each of $V_{left}$ (node 0), nodes $N_1$ through $N_8$, and $V_{right}$ (node 9) is as shown in the following table:

| Node | Voltage (V) |
| --- | --- |
| 0 ($V_{left}$) | 0 |
| 1 ($N_1$) | −4 |
| 2 ($N_2$) | −7 |
| 3 ($N_3$) | −9 |
| 4 ($N_4$) | −10 |
| 5 ($N_5$) | −10 |
| 6 ($N_6$) | −9 |
| 7 ($N_7$) | −7 |
| 8 ($N_8$) | −4 |
| 9 ($V_{right}$) | 0 |

Figure 2:
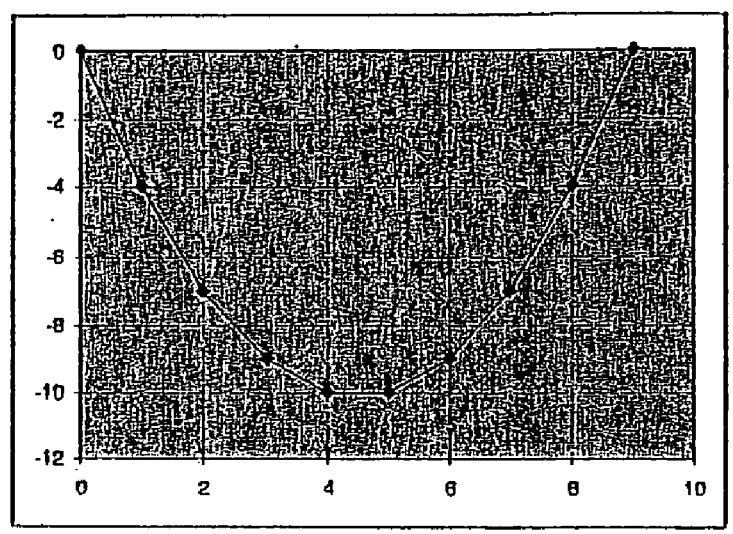
FIG. 2 is a graph showing the value of the reference voltage at each node in the impedance network of FIG. 1A or 1B upon an input voltage of zero volts being applied at each end of that impedance network.

When the data in the above table is plotted on a graph in which the vertical axis represents the voltage level in volts and the horizontal axis represents the physical distribution of nodes across resistor chain 100, the graph illustrated in FIG. 2 results. FIG. 2 illustrates the parabolic profile that results when each of $V_{left}$ and $V_{right}$ is maintained at a voltage of zero volts.

In alternative embodiment, where varying resistors and corresponding varying currents are used, different advantageous results can be achieved. For example, a linear characteristic may result that has modified impedance from the point of view of the comparator input currents. A parabola or other shape may then be produced and can vary according to the changing resistance and current values. In operation, this may result in a more finely tunable circuit. This would also make the tipping of the parabola more predictable and even adjustable.

Figure 1B:
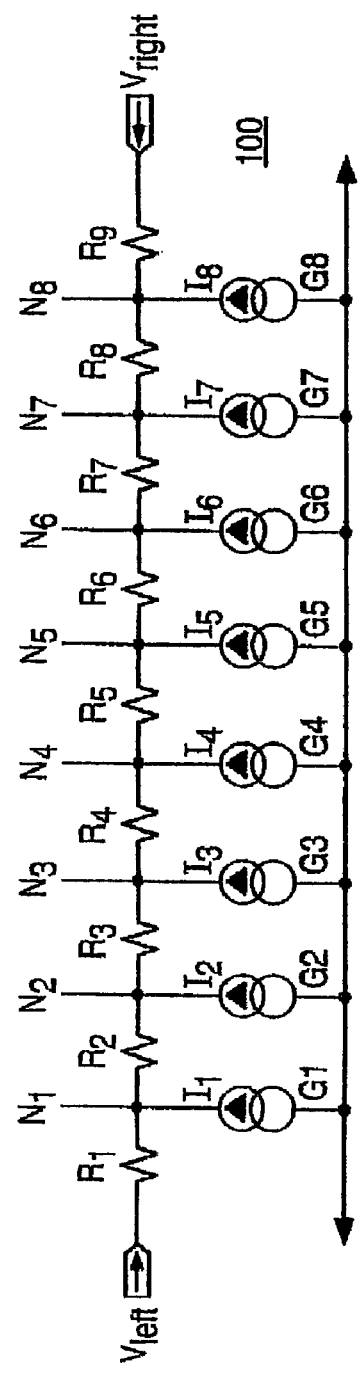
FIG. 1B is a circuit diagram of an impedance network for generating reference signals having a inverted parabolic profile, according to an embodiment of the invention.

In yet another embodiment, current sources may be employed to provide a reverse parabola for an output. Referring to FIG. 1B, such a circuit is illustrated. In the circuit 100B, the circuit includes current sources having reverse direction of current in contrast to the circuit illustrated in FIG. 1A. This allows for the output to be an inverted output compared to an output corresponding to a similar input to circuit 100A of FIG. 1A. This gives such a circuit the added advantage of moving the zero value to the opposite end of the chain of resistors, providing a means for removing even harmonic errors in the flash analog to digital transfer characteristic.

The effect of changing the values of $V_{left}$ and $V_{right}$ can be determined by superposition. Since the number of resistors in resistor chain 100 is one greater than the total number of nodes M, the impedance between $V_{left}$ and $V_{right}$ must be (M+1) AR, and so an additional current flows in the network equal to $(V_{left}-V_{right})/((M+1)*R))$. This causes the parabola to "tip", as illustrated in the graph in FIG. 3. The example illustrated in the graph in FIG. 3 shows the effect of an input signal in the form of a 4.0-volt difference between $V_{left}$ and $V_{right}$.

Figure 3:
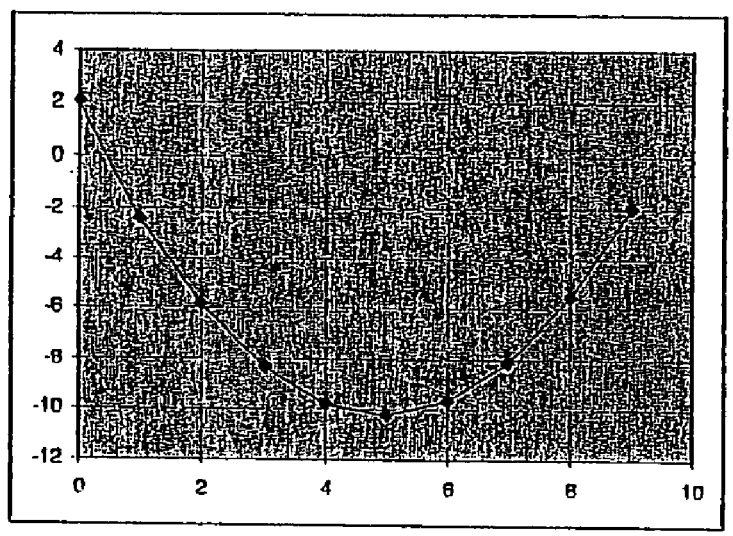
FIG. 3 is a graph showing the value of the reference voltage at each node in the impedance network of FIG. 1A or 1B upon application of a differential input voltage of 4.0 volts across that impedance network.

If a circuit were configured to measure the voltage difference between adjacent nodes on the resistor chain 100, it can be seen from the examples in FIG. 2 and FIG. 3 that, with zero input voltage (the differential input voltage being $V_{left}-V_{right}$) the circuit between nodes $N_4$ and $N_5$ would see no voltage difference (both are at −10.0 V in the example in FIG. 2), but when an input signal is applied there is a voltage difference between nodes $N_4$ and $N_5$. According to the invention: by looking at adjacent nodes, the circuit produces a zero value that may be attributable to different resistors along the resistor chain 100 as the differential input signal varies. It follows that, if the circuit between adjacent nodes were a comparator, the result would be a varying [Better term here Martin?] code of outputs. This produces, in effect, a differential input flash converter.

However, by closely analyzing the voltage differences between adjacent nodes of resistor chain 100, in conventional circuits, there exists an inherent problem with using an impedance network like resistor chain 100 in a flash converter. Such a circuit results in a significant, and undesirable, attenuation in the input signal, which will affect the operation of the converter. Recall that, when each of $V_{left}$ and $V_{right}$ were maintained at zero volts, the value of the voltage at a given node having index i is as follows:

$$\frac{\left(\left(\frac{M}{2}-i\right)^2+\left(\frac{M}{2}-i\right)\right)-\left(\left(\frac{M}{2}\right)^2+\left(\frac{M}{2}\right)\right)}{2} \cdot I \cdot R$$

Therefore, the voltage difference $V_i$ between the respective voltage values at a node having an index i and an adjacent node having an index i+1, once simplified, results in the voltage difference $V_i$ between adjacent nodes having the following value:

$$\left(\frac{M}{2}-i\right) \cdot I \cdot R$$

Figure 4:
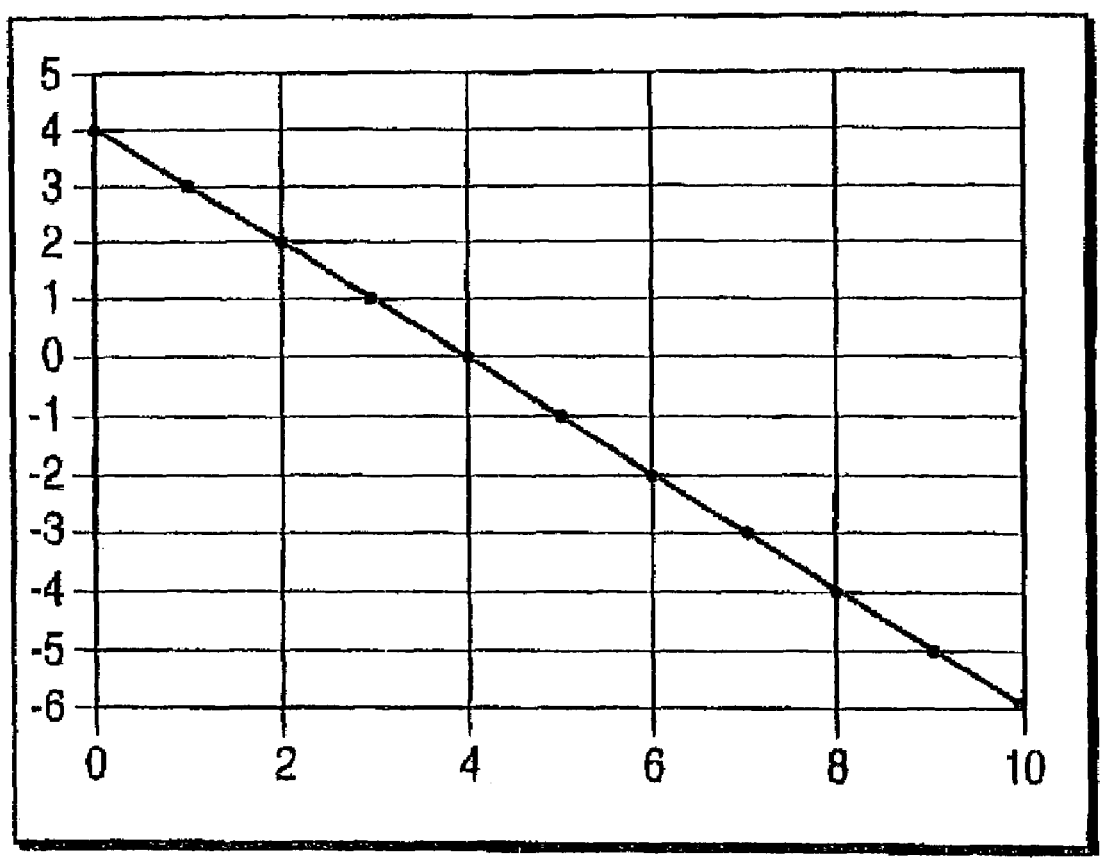
FIG. 4 is a graph showing the voltage difference between adjacent nodes of the impedance network of FIG. 1A or 1B.

When the voltage difference $V_i$ is plotted on a vertical axis against a horizontal axis representing the index i, the result is linear as expected. This is illustrated in the graph in FIG. 4 (which again shows the example where I*R=1 volt).

If the differential input signal $V_{in}$ is superimposed, then the voltage difference $V_i$ between a node having an index i and a node having an index i+1 is:

$$V_i = \left(\left(\frac{M}{2}-i\right) \cdot I \cdot R\right) + \left(\frac{V_{in}}{M+1}\right)$$

Note that the input signal $V_{in}$ is attenuated by 1/(M+1), which may be a significant attenuation.

Figure 5:
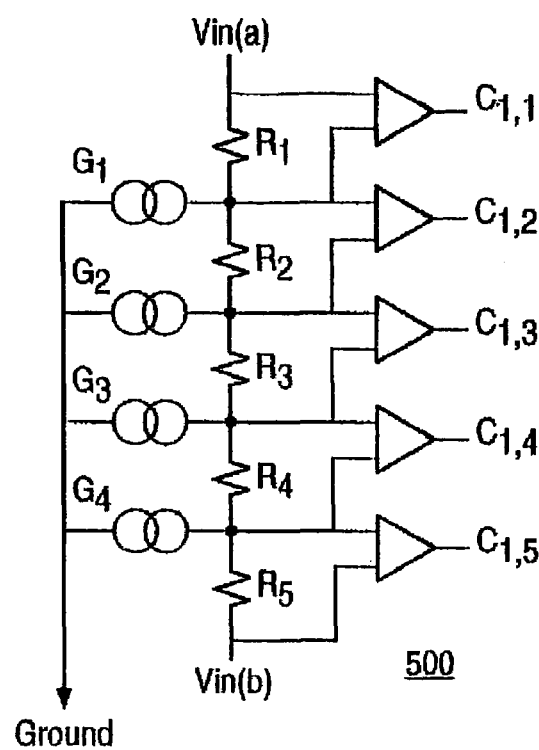
FIG. 5 is a schematic diagram of one embodiment of a differential input flash analog-to-digital converter using the impedance network of FIG. 1A or 1B.

According to another embodiment of the invention, for a resistor chain 100 (FIG. 1 or 1B) with M nodes (and hence M+1 resistors), a comparator can be placed across each of the M+1 resistors to make a flash analog-to-digital converter. This is illustrated in FIG. 5, in which a flash converter 500 comprises a first plurality of comparators $C_{1,1}$, $C_{1,2}$, $C_{1,3}$, $C_{1,4}$, and $C_{1,5}$, each placed across a corresponding resistor $R_1$, $R_2$, $R_3$, $R_4$, or $R_5$ connected in series in resistor chain 100, defining between them nodes $N_1$, $N_2$, $N_3$, and $N_4$, from each of which a corresponding current source $G_1$, $G_2$, $G_3$, or $G_4$ draws a current having a value of I. Each resistor $R_1$, $R_2$, $R_3$, $R_4$, and $R_5$ has a value R. The input signal $V_{in}$, expressed as the difference between the signals $V_{left}$ and $V_{right}$ (or $V_{in(a)}$ and $V_{in(b)}$ respectively) is inherently differential and causes the "zero" of the reference signals to move along the nodes of resistor chain 100 (the zeros being all equally distributed). In the flash converter 500, the comparator currents do not accumulate. Also, the voltage step size between adjacent nodes in resistor chain 100 can be easily changed given that the difference between adjacent nodes is a function of I*R; therefore, the voltage range is adjustable by the current.

In the flash converter circuit of FIG. 5, attenuation of the input signal $V_{in}$ may occur. For example, where M=32, the input signal may be attenuated by 32:1. This means that the comparator array of flash converter 500 may see a smaller signal, possibly making resistor chain 100 impractical for use as an impedance network in certain applications of a flash converter without further modifications to the comparator array.

In another embodiment of the invention, in order to reduce the attenuation of the input signal $V_{in}$, it is possible to modify the flash converter 500. In such an embodiment, rather than comparing reference voltages between adjacent nodes of resistor chain 100 (having indices i and i+1 respectively), each comparator is configured to compare reference voltages between non-adjacent nodes. For example, a first node having an index i may be compared to a second node separated "n" nodes from the first node and having an index i+n, where n is an integer greater than 1. Referring again at the expression for the voltage difference between nodes on resistor chain 100, it can be determined that the voltage difference $V_{i,n}$ between a node having an index i and a node having an index i+n is as follows:

$$V_{i,n} = \frac{n \cdot (M-2 \cdot i-n+1)}{2} \cdot I \cdot R$$

This differs from its neighbor at $V_{i+1,n}$ by I*R, the same difference, independent of the value of n. However, when the input signal $V_{in}$ is superimposed, it can be seen that the voltage difference $V_{i,n}$ is now:

$$V_{i,n} = \frac{n \cdot (M - 2 \cdot i - n + 1)}{2} \cdot I \cdot R + \left(\frac{V_{in} \cdot n}{M+1}\right)$$

In this configuration, attenuation of the circuits is reduced. More particularly, input signal $V_{in}$ is now attenuated by $n/(M+1)$ rather than $1/(M+1)$. It is n times bigger than the simple case. It can be seen that if n were made as large as, for example, M/2, the attenuation factor could be increased to approximately 0.5. However, if n is increased to M/2, then much of the resistor network cannot be used. In the example where M=8, n=4, the first comparator would be placed between $V_{left}$ and node $N_4$, the second comparator between nodes $N_1$ and $N_5$, and so on, ending with the sixth comparator between node $N_5$ and $V_{right}$. As a result, the flash converter would have only six comparison points rather than the nine that are contemplated, which might be insufficient to ensure that an accurate digital output is produced by the flash converter.

Figure 6:
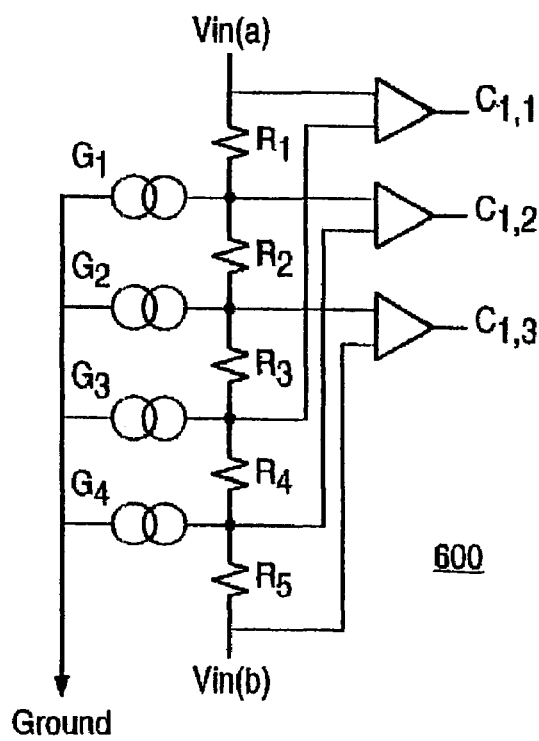
FIG. 6 is a schematic diagram of another embodiment of a differential input flash analog-to-digital converter using the impedance network of FIG. 1A or 1B.

This reduction in comparison points is illustrated in FIG. 6, which depicts a flash converter 600 in which each comparator $C_{1,1}$, $C_{1,2}$, and $C_{1,3}$ compares reference signals between every third node (that is, M=4 and n=3), rather than between every adjacent node as was the case in the example illustrated in FIG. 5. The flash converter 600 illustrated in FIG. 6 still exhibits the same advantages as the flash converter 500 illustrated in FIG. 5, including the fact that the input is differential, the voltage range can be set by adjusting the current, and the comparator input currents do not accumulate. However, the flash converter 600 also results in increased gain from input compared to the flash converter 500. However, on the flash converter 600 also has new disadvantages; in particular, the number of comparison points is reduced Also, more of the comparison voltages are located in the "middle" of the range, resulting in a possible inability to produce an accurate digital output.

In another embodiment of the invention, the number of comparison points may be increased. By solving the equation:

$$V_{i,n} = \frac{n \cdot (M - 2 \cdot i - n + 1)}{2} \cdot I \cdot R + \left(\frac{V_{in} \cdot n}{M+1}\right)$$

for $V_{i,n}=0$, it can be seen that:

$$V_{in} = \frac{(-M + 2 \cdot i + n + 1) \cdot (M+1) \cdot I \cdot R}{2}$$

This is the value of $V_{in}$ that gives a zero at the comparison point between node i and node i+n. Differentiating with respect to i shows that adjacent nodes differ by:

$$(M+1) \cdot I \cdot R$$

This result is independent of the value of n, as expected. However, differentiating with respect to n shows that adjacent values of n differ by:

$$\frac{(M+1) \cdot I \cdot R}{2}$$

This is one half of one nominal step. Therefore a set of comparisons iterated over i based on n differs from a set of comparisons iterated over i based on n+1 by exactly half of one step.

Consequently, in order to increase the gain, n cannot be 1 and, n should be as large as M/2 (that is, $1<n \leq M/2$). In a preferred embodiment, n should not exceed M/2. To do so would reduce the number of comparison points. Therefore, only half the available connections are used. Also, the converter uses only half of the available comparison points. According to one embodiment of the invention, two adjacent values of n each within $(M/2) \pm 1$, namely an $n_1$ and $n_2$ having the following values: $n_1 \cong M/2$ and $n_2 = n_1 \pm 1$. In a preferred embodiment $n_1$ should be the largest integer not exceeding M/2, and $n_2$ should be $n_1+1$. This results in the recovery of a total of at least M comparison points. This is true even though only half of the range is used, but with acceptable attenuation. Thus, the comparators that were obviated in the above embodiment can be recovered by adding a second plurality of comparators to resistor chain 100. This second plurality of comparators is configured with a step size "$n_2$" between nodes. This differs from the step size "$n_1$" between nodes for the first plurality of comparators. In a preferred embodiment, the step size for the second plurality of comparators differs from the first plurality of comparator by one step. It is technically possible for $n_1$ to have any value where $1<n_1 \leq M/2$ and for $n_2$ to have any value where $1<n_2 \leq n_1+1$. In a preferred embodiment, however $n1 \cong M/2$ and that $n_2 = n_1 \pm 1$. This prevents the introduction of undue attenuation while attempting to maximize the number of total comparison points.

For example, in a resistor chain 100 having 32 resistors, one set of comparison points can be obtained by placing a first plurality of comparators between every 15$^{th}$ node, namely, between $V_{left}$ and node $N_{15}$, between nodes $N_1$ and $N_{16}$, between nodes $N_2$ and $N_{17}$, ..., between nodes $N_{17}$ and $N_{32}$, and between node $N_{18}$ and $V_{right}$, resulting in nineteen comparators. However, placing a second plurality of comparators between every 16$^{th}$ node, namely, between $V_{left}$ and node $N_{16}$, between nodes $N_1$ and $N_{17}$, between nodes $N_2$ and $N_{18}$, ..., between nodes $N_{16}$ and $N_{32}$, and between node $N_{17}$ and $V_{right}$, introduces another eighteen comparators having comparison points exactly halfway between the first plurality of nineteen comparators. Consequently, the resulting converter has thirty-seven comparators, each of which attenuates the input signal by only about 50%. Unlike conventional configurations, all of these comparators are actual comparators, not "pseudo-comparators". According to the invention, both the first and second pluralities of comparators are connected to the resistor chain 100 itself, and are not cascaded such that the second plurality of comparators are connected to the outputs of the first plurality of comparators.

Figure 7:
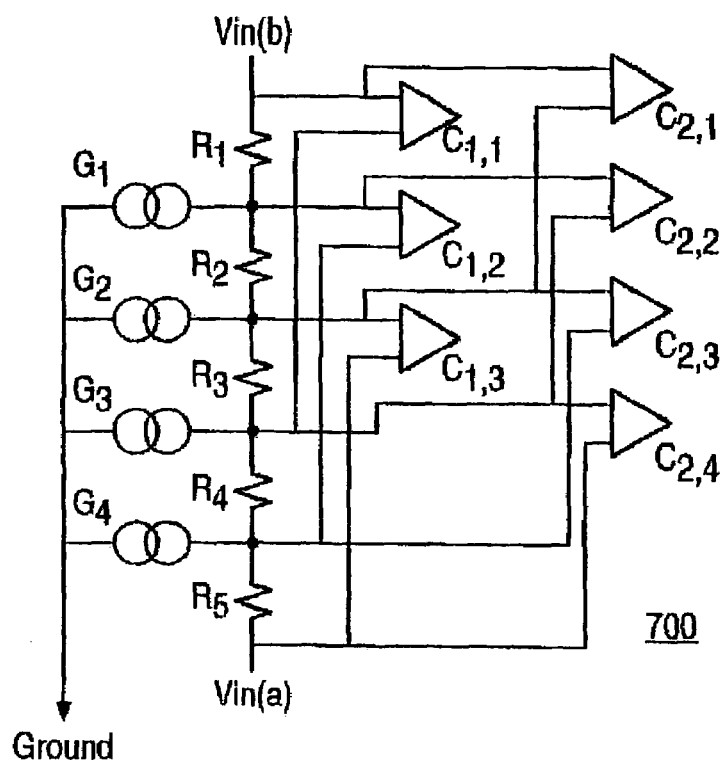
FIG. 7 is a schematic diagram of another embodiment of a differential input flash analog-to-digital converter using the impedance network of FIG. 1A or 1B.

FIG. 7 illustrates the application of this principle by taking the flash converter 600 depicted in FIG. 6 and adding a second plurality of comparators $C_{2,1}$, $C_{2,2}$, $C_{2,3}$, and $C_{2,4}$ in order to create an improved flash converter 700. While the first plurality of comparators $C_{1,1}$, $C_{1,2}$, and $C_{1,3}$ compares reference signals between every third node ($n_1=3$), the second plurality of comparators $C_{2,1}$, $C_{2,2}$, $C_{2,3}$, and $C_{2,4}$ compares reference signals between every second node ($n_2=2$). In this way, some of the comparators that may have been obviated in the above embodiments have been recovered by introducing a second plurality of comparators with a step size that is just one different from that of the first plurality. The improved flash converter 700 illustrated in FIG. 7 maintains the advantages of the flash converter 600 illustrated in FIG. 6, including the fact that the input is differential, the voltage range can be set by adjusting the current, and the comparator input currents do not accumulate. Further, the improved flash converter 40 has the additional advantage of an increased number of comparators and an increased number of comparison points, without a corresponding loss in input gain.

According to another embodiment of the invention, a further improvement can be made to the flash converter 700 to maximize the available range over which the comparators operate. This is accomplished by introducing a third plurality of comparators. This third plurality of comparators are configured to have zero value outside the range of the first two interleaved pluralities of comparators. The third plurality of comparators are configured to compare signals produced at reference nodes separated from each other by a step size "$n_3$" The new stop size $n_3$ is less than the step size $n_1$ of the first plurality of comparators or the step size $n_2$ of the second plurality of comparators. While doing so actually has a somewhat negative effect on the attenuation of the input signal, it is nevertheless desirable to maximize the active comparison range of the converter despite this slight attenuation.

Figure 8:
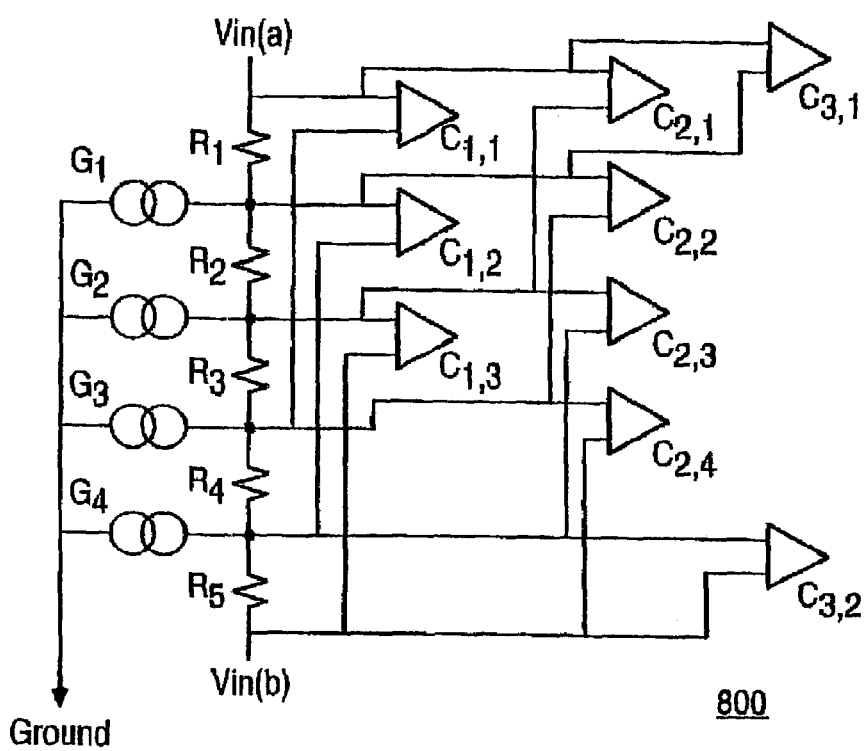
FIG. 8 is a schematic diagram of another embodiment of a differential input flash analog-to-digital converter using the impedance network of FIG. 1A or 1B.

A flash converter 800 incorporating a third plurality of comparators is illustrated in FIG. 8. The third plurality of comparators $C_{3,1}$ and $C_{3,2}$ includes comparators having a zero outside the range of the first two interleaved pluralities of comparators $C_{1,1} \ldots C_{1,3}$, and $C_{2,1} \ldots C_{2,4}$ and does not comprise another full set of comparators across the resistor chain 100. This allows the preferred flash converter 800 to compare reference signals where necessary towards each end of the available range (i.e. signals produced at reference nodes separated from each other by $n_3$ nodes, where $n_3$ is an integer less than $n_1$ or $n_2$), At the same time, flash converter 800 avoids any unnecessary attenuation of the input signal.

The flash converter 800 has almost three times the expected number of comparators two-thirds of which are ideal and one-third are compromised because they have a significant attenuation. However, all of the compromised comparators operate outside the nominal operating range. The flash converter 800 maintains all of the advantages of the improved flash converter 700, but has the additional advantage of using all of the available comparison range.

As will be apparent to those skilled in the art in the light of the foregoing disclosure, many alterations and modifications are possible in the practice of this invention without departing from the spirit or scope thereof. For example, in one embodiment, the comparator may be made with CMOS input devices thus essentially removing any input current considerations. As another example, the comparators may be auto-zeroed by use of switched capacitor connections. Although the reference levels of the converter set by the currents are described herein as all being equal in order to create a linear transfer characteristic—the invention provides an embodiment that maintains the differential input characteristic even if all the currents are not equal but set to create a non-linear transfer characteristic. Accordingly, the scope of the invention is to be construed in accordance with the substance defined by the following claims.

What is claimed is:

1. An analog-to-digital converter comprising:
   a plurality of current sources, with an individual current source coupled to each one of the reference nodes, each one of the current sources being coupled to draw a current from a corresponding one of the reference nodes to provide a plurality of reference signals at the reference nodes having a parabolic profile overall; and
   a plurality of comparators for comparing signals between reference nodes separated from each other by a predetermined node.

2. The converter according to claim 1 wherein the plurality of comparators for comparing signals between reference nodes are separated from each other by $n_1$ nodes and for providing digital signal outputs therefrom, $n_1$.

3. The converter according to claim 2, further comprising an analog-to-digital converter comprising:
   grounded first and second input terminals for receiving an analog input signal;
   an impedance network comprising a plurality of resistors coupled in series and defining M reference nodes between the first and second input terminals.

4. The converter claimed in claim 3, wherein the resistors have substantially equal resistance values.

5. The converter according to claim 3, wherein $n_1$ and M are integers.

6. The converter according to claim 3, wherein $1 < n_1 \leq M$.

7. The converter claimed in claim 1, wherein the value of the individual current drawn from each reference node has substantially equal value to currents drawn from other nodes.

8. The converter according to claim 1, where the current source is configured to draw reverse current from the node to provide a plurality of reference signals at the reference nodes, giving an inverted parabolic profile.

9. The converter according to claim 1, where the current source is configured to be a variable current source configured to draw current from the node to compensate for possibly varying resistance values to create a non-linear transfer characteristic.

10. The converter according to claim 1, wherein the plurality of resistors includes a variable resistor, and wherein a current source is coupled to the variable resistor to create a non-linear transfer characteristic.

* * * * *